United States Patent [19]
Metzler et al.

[11] Patent Number: 5,898,982
[45] Date of Patent: May 4, 1999

[54] THIN FILM CAPACITORS

[75] Inventors: Richard A. Metzler, Mission Viejo; Vladimir Rodov, Redondo Beach, both of Calif.

[73] Assignee: Luminous Intent, Inc., Costa Mesa, Calif.

[21] Appl. No.: 08/866,589

[22] Filed: May 30, 1997

[51] Int. Cl.$^6$ ................................................ H01G 7/00
[52] U.S. Cl. ............................................... 29/25.42
[58] Field of Search ................ 29/25.42; 361/321.1, 361/305, 311

[56] References Cited

U.S. PATENT DOCUMENTS

| | | | |
|---|---|---|---|
| 5,126,916 | 6/1992 | Tseng | 29/25.42 |
| 5,550,077 | 8/1996 | Tseng et al. | |
| 5,566,045 | 10/1996 | Summerfelt et al. | 29/25.42 |
| 5,573,967 | 11/1996 | Tseng | |
| 5,574,621 | 11/1996 | Sakamoto et al. | |
| 5,595,926 | 1/1997 | Tseng | |
| 5,616,511 | 4/1997 | Hirota | |
| 5,618,745 | 4/1997 | Kita | |
| 5,712,759 | 1/1998 | Saenger et al. | 29/25.42 |

Primary Examiner—David A. Scherbel
Assistant Examiner—Benjamin Halpern
Attorney, Agent, or Firm—Blakely, Sokoloff, Taylor & Zafman LLP

[57] ABSTRACT

The present invention comprises capacitors, and methods of manufacturing the same, having a plurality of vertical plates formed on a substrate in a manner so as to have a high capacitance in a small space and to have good time and temperature stability. Vertical plates are initially formed as sidewall electrode depositions to pedestals formed on a substrate, and through a series of processing steps, additional vertical plates are formed so that multiple capacitor plate—dielectric—capacitor plate combinations are formed around each of the initial vertical plates. Exemplary embodiments and methods of fabrication are disclosed.

12 Claims, 9 Drawing Sheets

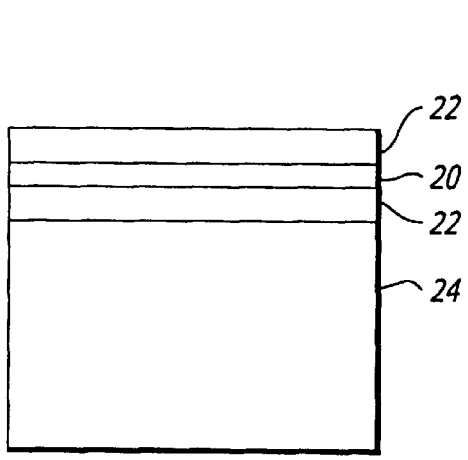
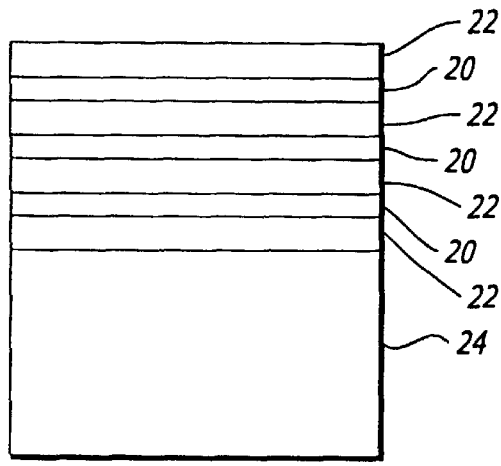
FIG. 1  FIG. 2
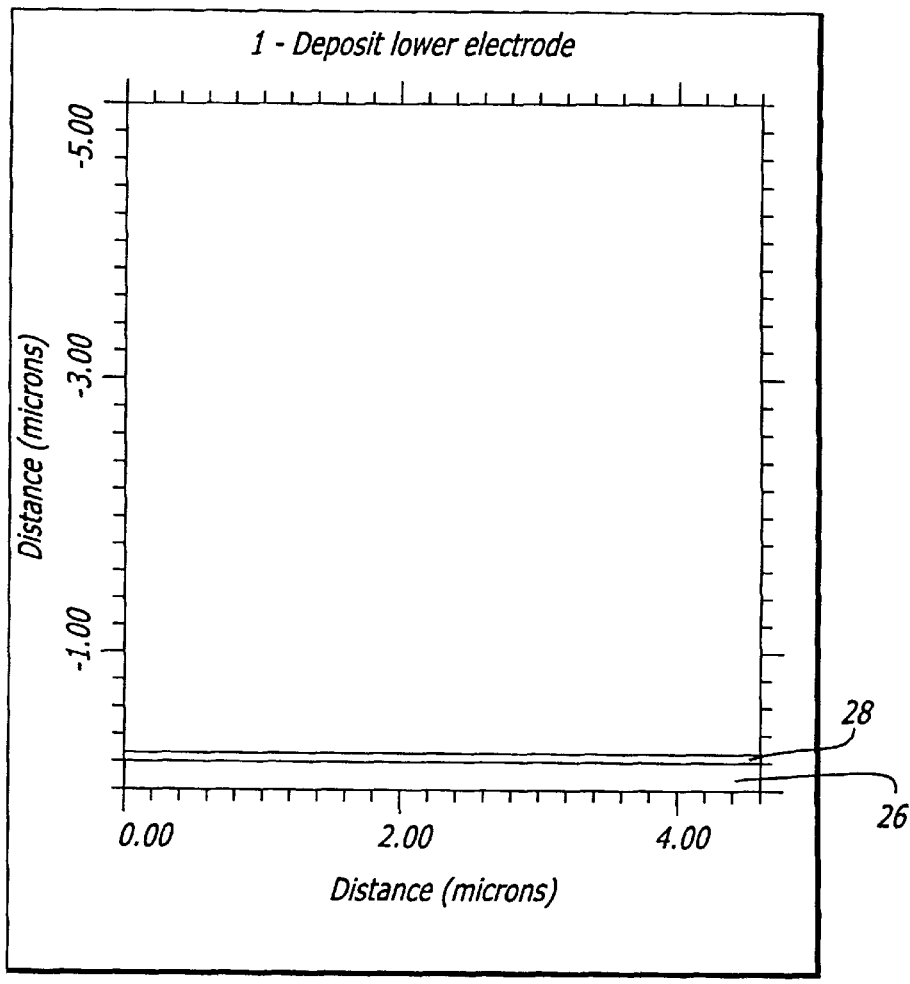
FIG. 3

THIN FILM CAPACITORS

BACKGROUND OF THE INVENTION

1. Field of the Invention

The present invention relates to the field of capacitor design and fabrication.

2. Prior Art

A number of problems exist in state-of-the-art capacitors. Capacitors are generally inexpensive, causing manufacturers to eliminate leading edge technology as too costly for these products. Instead, manufacturers tend to move toward finding dielectrics with higher dielectric constants to enhance the capacitance per unit area. This leads to compromises in other parameters, such as dielectric strength, uniformity of layers, reliability, stability, degradation of materials and ultimately to increased capacitor volume, thereby compromising the capacitance per unit volume.

Capacitors have been made by sandwiching a layer of dielectric 20 between two conductive layers 22 on a substrate 24, as shown in FIG. 1. This allows only one plate, and therefore provides a relatively low capacitance. Attempts have been made in the prior art to achieve higher capacitances by stacking multiple layers (FIG. 2), but this still does not reach the capacitance per unit area of the present invention.

The prior art devices tend to use a dielectric material that is on the order of several thousandths of an inch thick, in comparison to the present invention which has dielectric thicknesses which are significantly less than 1 micron (1 thousandth of an inch=25 microns). Also the prior art devices generally use a high dielectric constant material such as Barium Titanate. However these materials have low dielectric strengths and substantial variations of properties with temperature and age. They thus give lower voltage results and poor reliability.

BRIEF SUMMARY OF THE INVENTION

The present invention comprises capacitors, and methods of manufacturing the same, having a plurality of vertical plates formed on a substrate in a manner so as to have a high capacitance in a small space and to have good time and temperature stability. Vertical plates are initially formed as sidewall electrode depositions to pedestals formed on a substrate, and through a series of processing steps, additional vertical plates are formed so that multiple capacitor plate—dielectric—capacitor plate combinations are formed around each of the initial vertical plates. The plate orientation and aspect ratio and the thin dielectric used in the present invention results in a high capacitance per unit area for capacitors manufactured in accordance with the present invention. Exemplary embodiments and methods of fabrication are disclosed.

BRIEF DESCRIPTION OF THE DRAWINGS

FIG. 1 is an illustration of prior art capacitors made by sandwiching a layer of dielectric between two conductive layers on a substrate.

FIG. 2 is an illustration of prior art capacitors Attempts made by stacking multiple capacitor plate layers.

FIGS. 3 through 17 illustrate the step by step formation of exemplary capacitors in accordance with the present invention, with FIG. 17 providing a cross section of a finished capacitor in accordance with the present invention.

DETAILED DESCRIPTION OF THE INVENTION

The present invention comprises capacitors, and methods of manufacturing the same, having a plurality of vertical plates formed on a substrate in a manner so as to have a high capacitance in a small space and to have good time and temperature stability. The resulting structure of the capacitors is best understood by a description of exemplary manufacturing techniques, and accordingly the same shall now be described.

The capacitors of the present invention are formed on a suitable substrate by a series of depositing and etching steps. This substrate may be any of a number of materials, the fundamental substrate requirements being stability with time and temperature, a coefficient of thermal expansion that is not excessive and cost. Electrical characteristics of the substrate are not particularly important, as the capacitor plates are deposited plates not depending on the characteristics of the substrate. While silicon is a suitable substrate, the present invention is not limited to silicon or even semiconductor substrates in general, as ceramics, by way of example, offer ready availability, suitable properties and low cost. In most of the following Figures however, only the layers above the substrate are shown, not the substrate also, as the Figures are approximately to scale for an exemplary embodiment, a scale in which the substrate would be out of proportion.

As shown in FIG. 3, the first step in the exemplary process is the deposition of the bottom electrode 26, preferably approximately 0.2 microns thick. While a TiN layer is preferred, any conductive material may be used which can withstand oxide deposition and densification temperatures (~800° C.). On top of this layer a thin layer of dielectric 28 is uniformly deposited. Silicon dioxide is preferred because of its high dielectric strength, but other dielectric materials may be used if desired.

Figure 4:
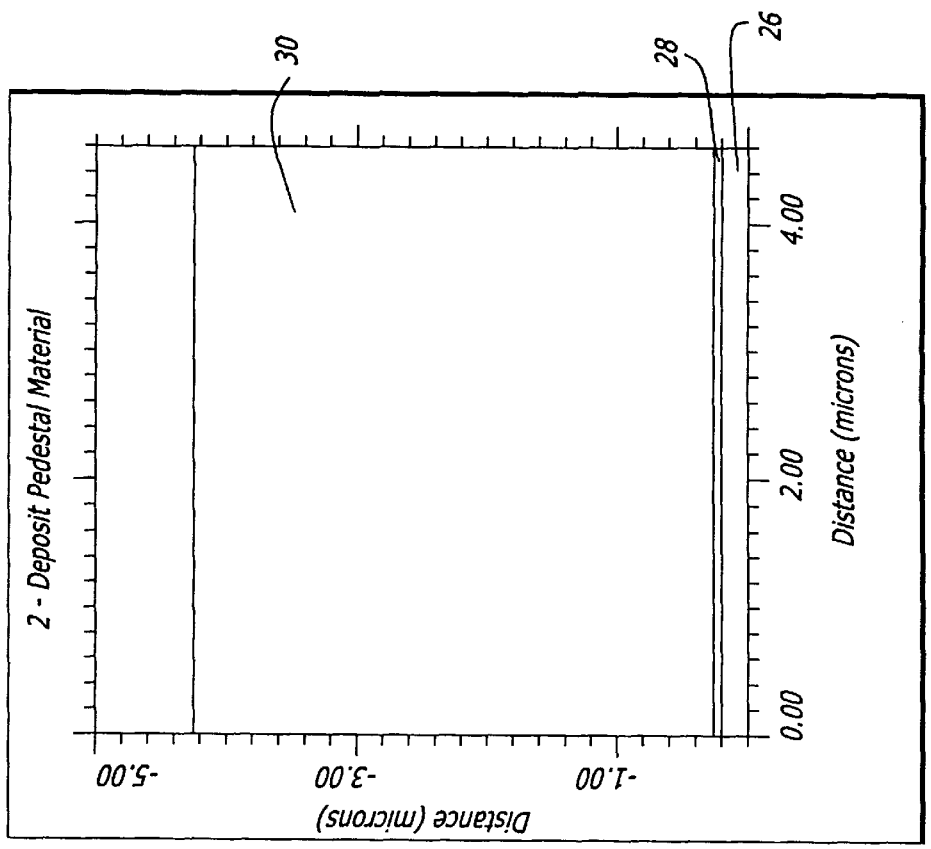

The next step, shown in FIG. 4, is the deposition of what will be referred to herein as a pedestal material 30. For the presently preferred embodiment, polysilicon was chosen because of its ready availability, but any material which has a reasonable etch differential between itself, the dielectric and what will become the electrode material may be used.

Figure 5:
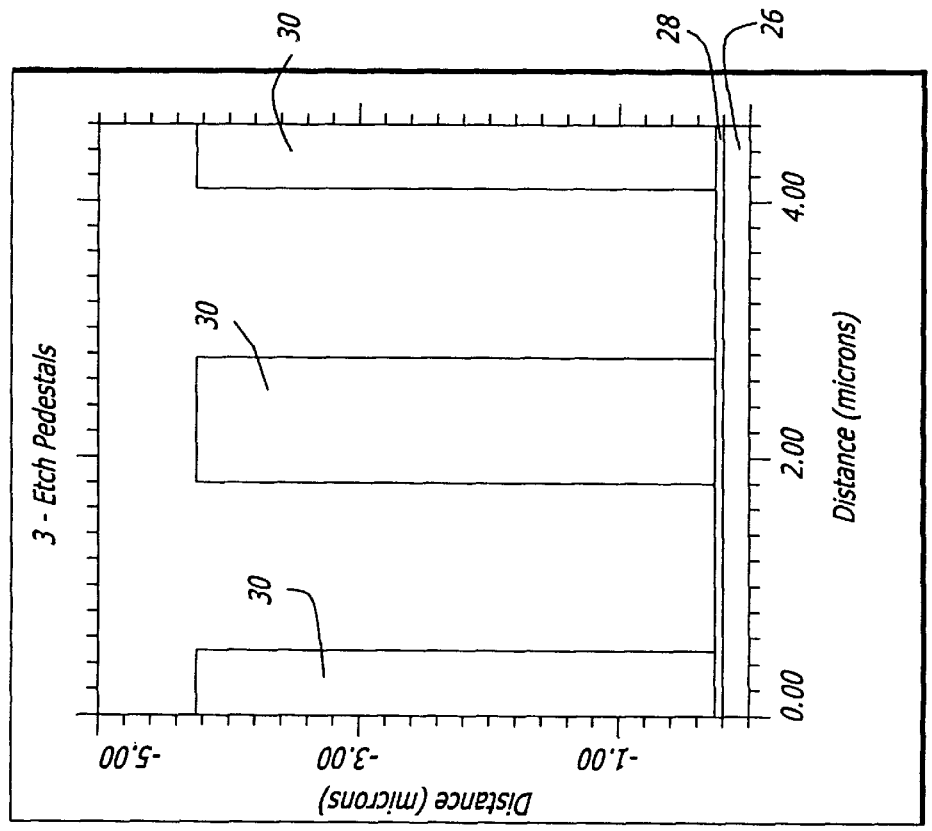
Figure 14:
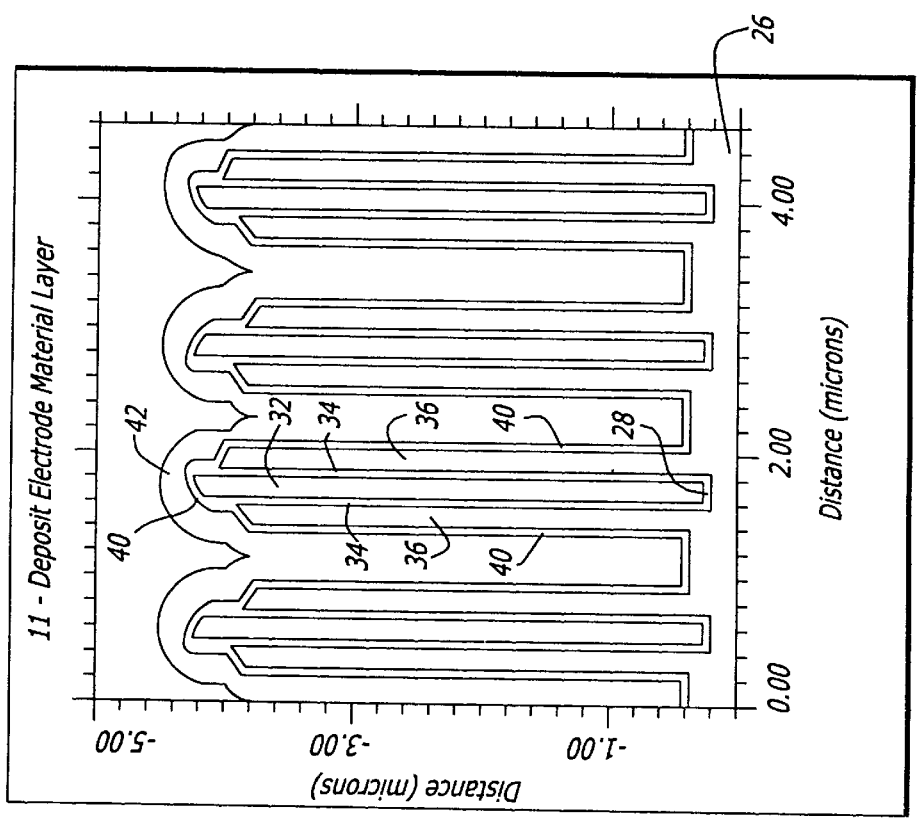

The next step, shown in FIG. 5, is the formation of individual, spaced apart pedestals 30 by a photo process. More specifically, the pedestal material is masked and then plasma etched to form pedestals with substantially straight sidewalls, as shown in FIG. 5. In the exemplary embodiment, the pedestals are 1 micron wide for ease of photolithography work, with a gap between pedestals of 1.3 microns. It should be understood that these dimensions are selected for the specific application, e.g., the 1.3 micron width implies a capacitor electrode thickness of 0.15 micron, combined with a pedestal thickness of 4 microns to give an aspect ratio of 10:1 for the trenches which will be filled toward the end of the process (FIG. 14). The pedestals preferably are in a two dimensional array, each pedestal having a geometrical cross section designed to interfit with each other to fill the array area. Any pattern can be used, such as cylindrical, square, triangular, hexagonal, or even oval. Also elongated shapes such as elongated rectangles, etc. may be used if desired. For the present devices, a square cross section was chosen for ease of analytical work.

Figure 7:
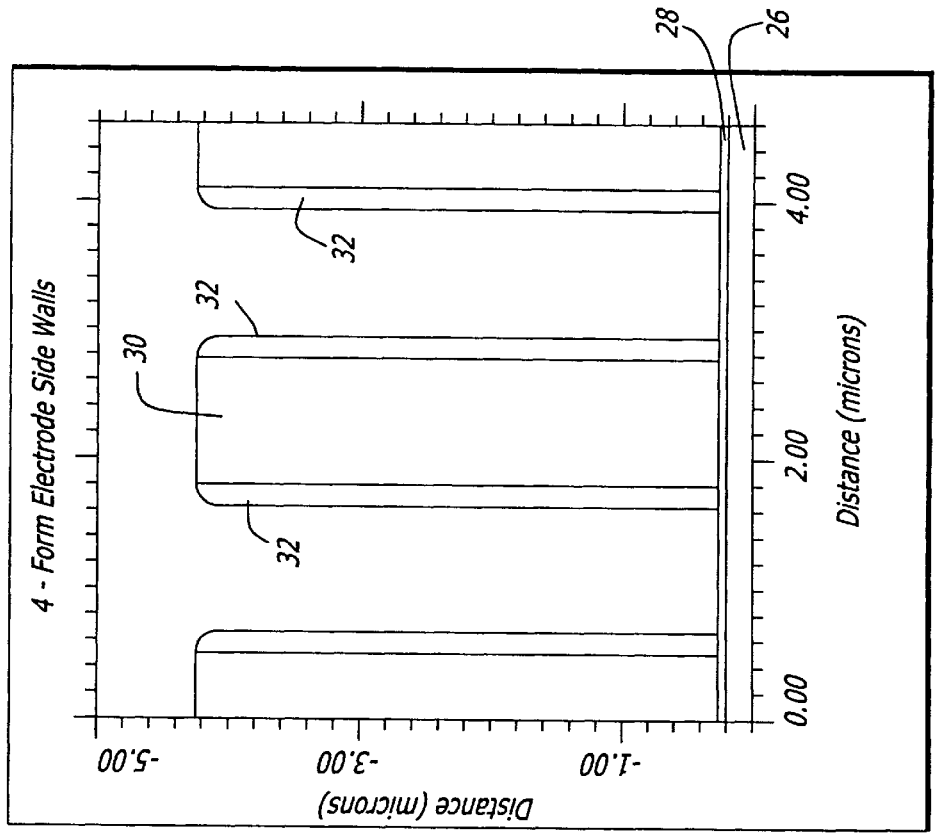
Figure 6:
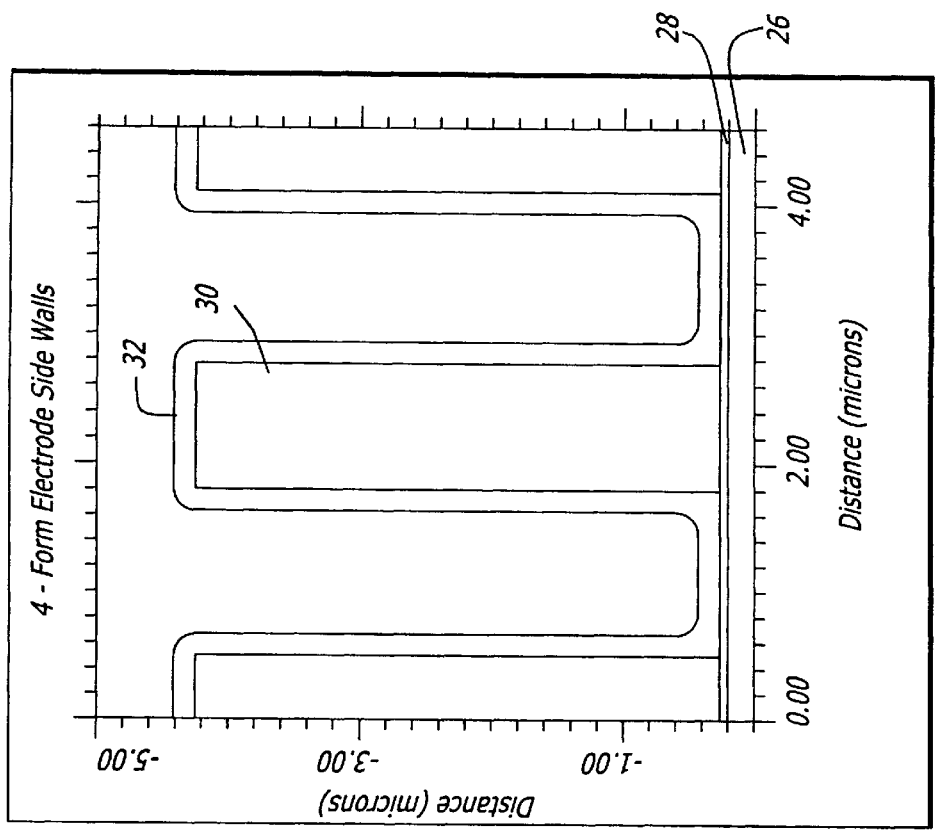
Figure 8:
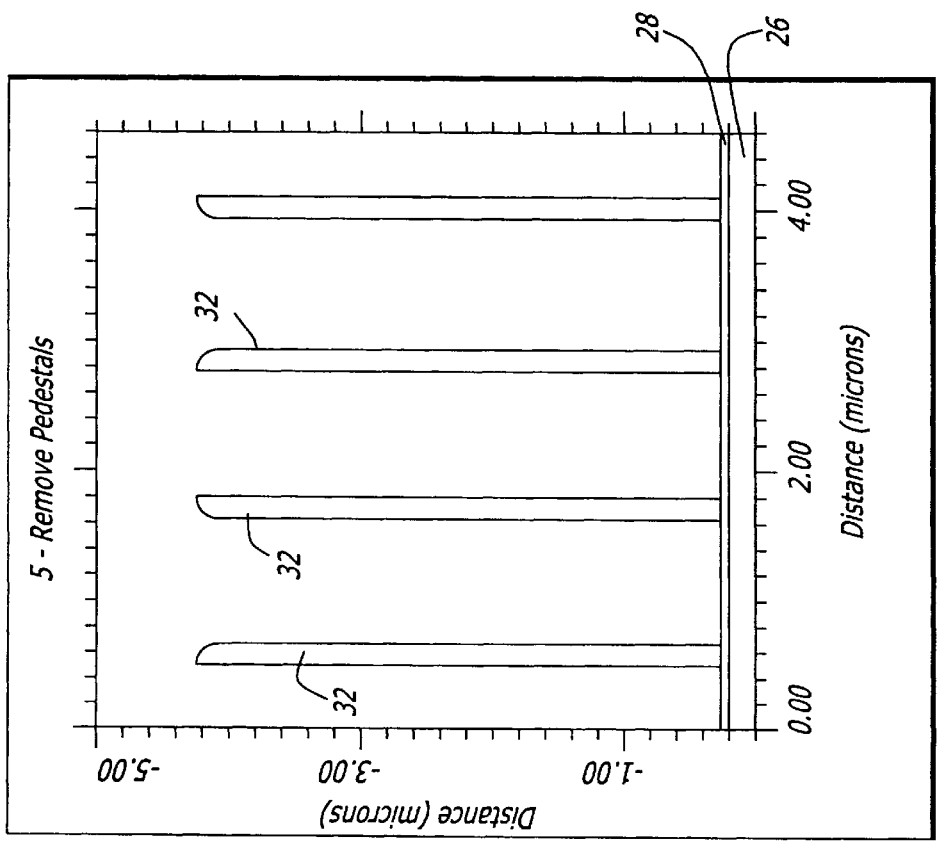

The next steps, shown in FIGS. 6 and 7, are the deposition and then the etching of the electrode sidewalls. Preferably the same material is used as for the base electrode (TiN) so that the expansion coefficients will be better matched; however, this is not a requirement. In these steps, first an electrode layer 32 is put down by chemical vapor deposition (CVD). Such a layer will coat all surfaces substantially evenly, whether the surface is a horizontal surface or a vertical surface, as shown in FIG. 6. The following etching step is a special type of plasma etch (RIE), a directional etch which etches only in a vertical direction at a substantially uniform rate across the area. By vertically etching an amount substantially equal to the deposition thickness, the CVD electrode layer 32 is removed from the horizontal surfaces, but because of the much larger effective vertical "thickness" of the deposited layer on the vertical surfaces, the etching has no significant effect on the deposited layer 32 on the vertical surfaces, as shown in FIG. 7. In the exemplary embodiment, the sidewall thickness is 0.15 microns (one half of the 0.3 micron difference between the pedestal width and the width of the space). This yields uniformly spaced vertical electrodes upon etching away the pedestal material, as shown in FIG. 8.

Figure 9:
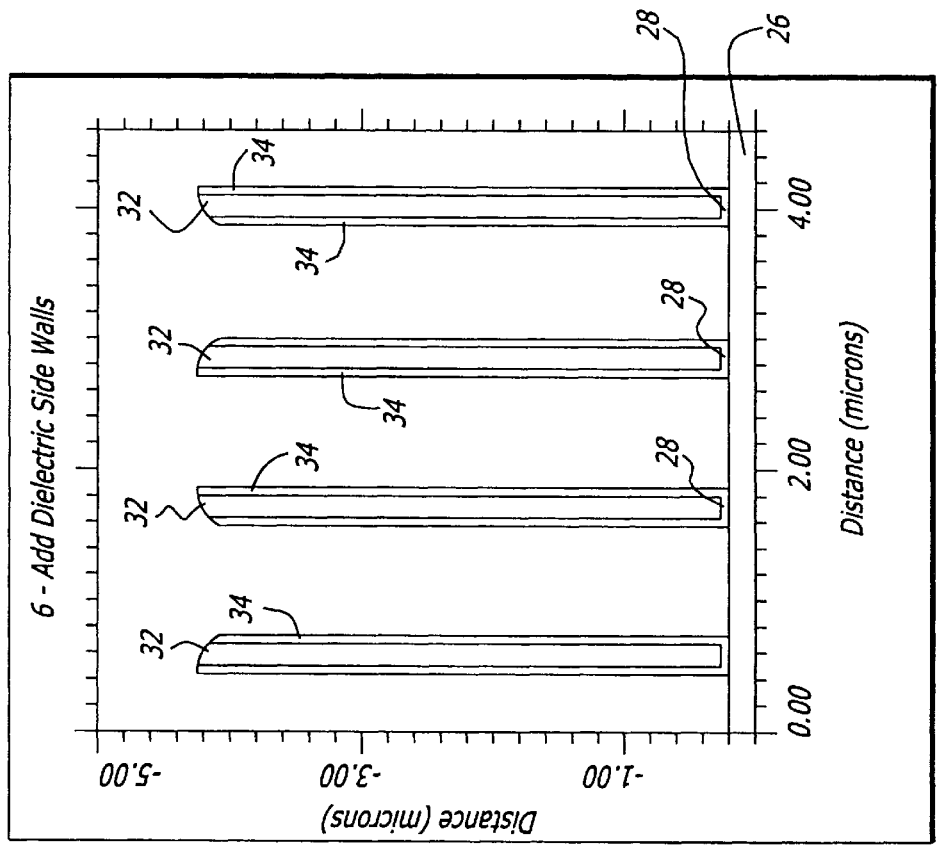

The next step in the fabrication process after removal of the pedestal material is the sidewall deposition and etching of dielectric material 34 to form the dielectric of the capacitor (see FIG. 9). As before, the dielectric 34 is preferably silicon dioxide, deposited uniformly over all surfaces, and the etch is a plasma etch of approximately the same thickness as the deposited dielectric, removing the dielectric from the horizontal surfaces but not the vertical surfaces. Note that this etch is purposely made adequate to remove the excess dielectric layer 28 from the base electrode 26 also.

Figure 10:
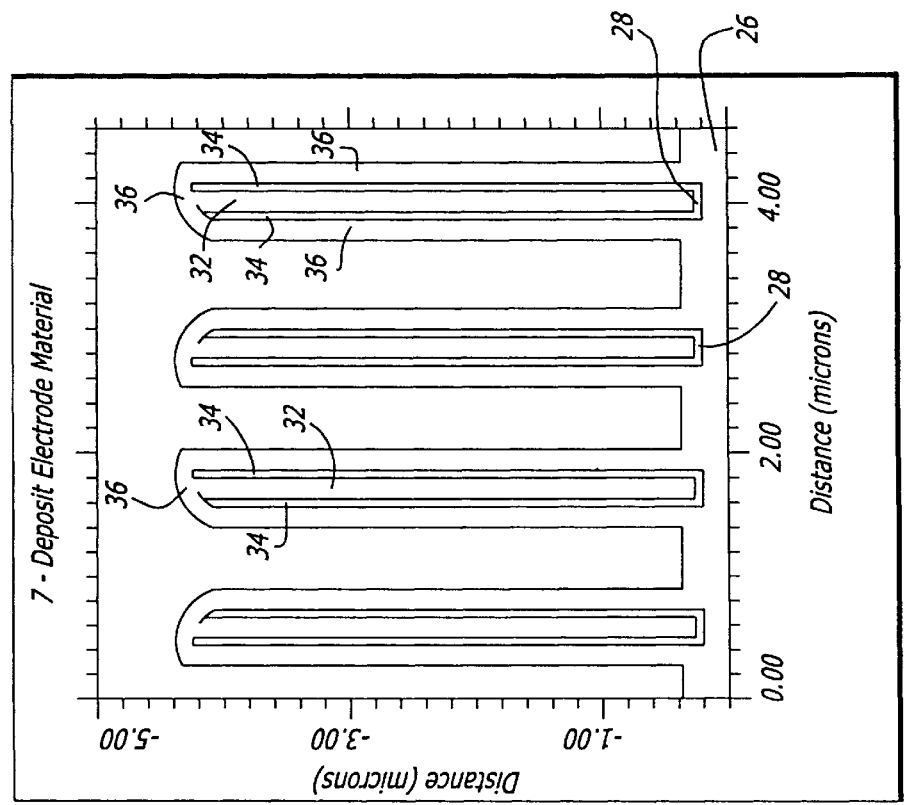

The next step, shown in FIG. 10, is the deposition of additional electrode material 36. This layer is preferably also 0.15 micron thick, the same material as, and electrically integral with, the initial electrode layer 26. Because of the advancements in the state-of-the-art thin film techniques, the dielectric and electrode layers 32, 34 and 36 could be made even thinner, and the number of them can be increased, increasing the capacitance because of the thinner dielectric and because of the increased number of capacitor plates. However, the dimensions of the presently preferred embodiment were selected as being more cost effective for the present state-of-the-art equipment. Further improvements may reduce feature sizes even more, resulting in further enhancements of volume capacitance.

Figure 11:
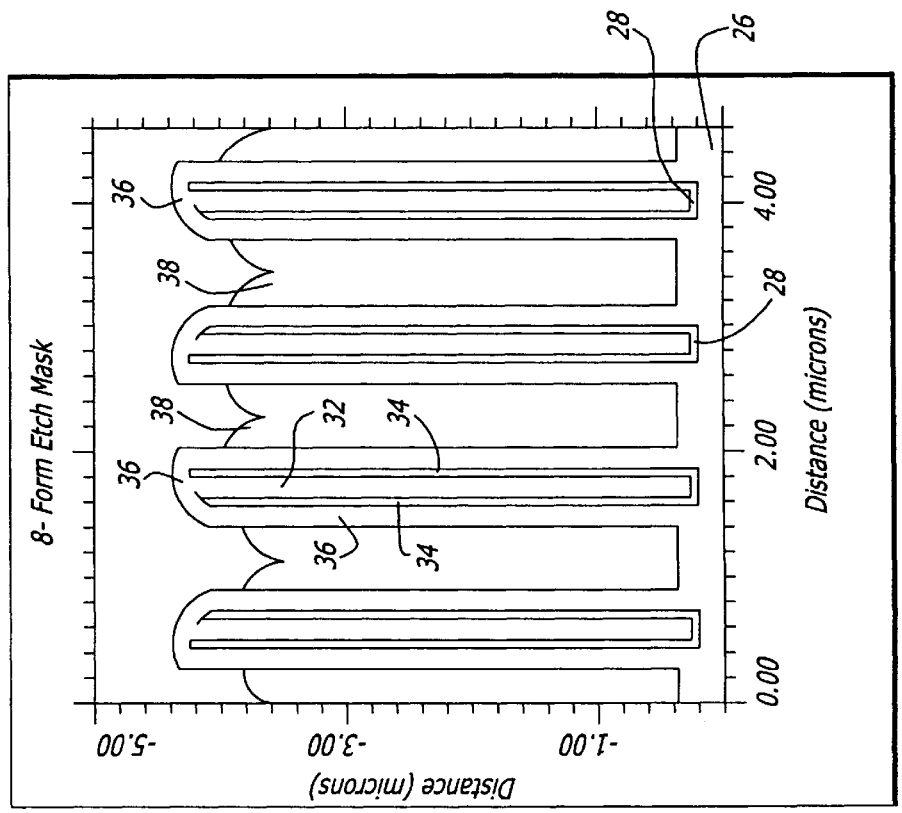
Figure 12:
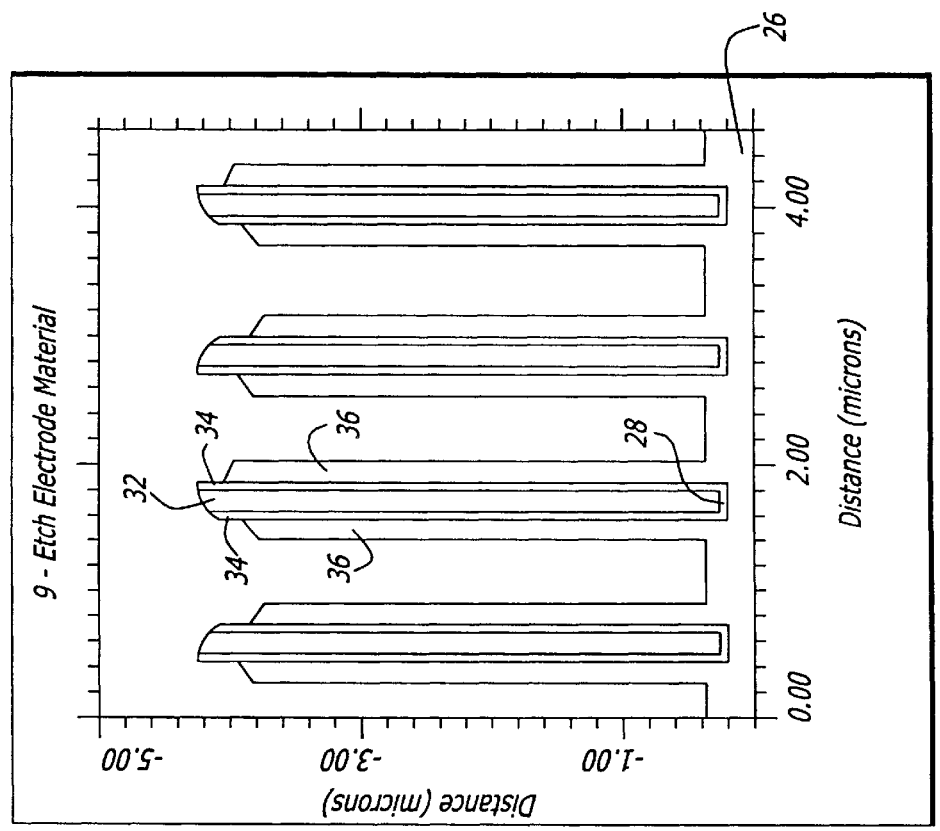

The next step, shown in FIG. 11, is the deposition and etching of an etch mask 38, such as silicon dioxide. This exposes the tops of the vertical posts formed thus far, allowing a subsequent wet etch of the electrode material to electrically separate the sidewall electrodes from the vertical post, as shown after removal of the etch mask in FIG. 12.

Figure 13:
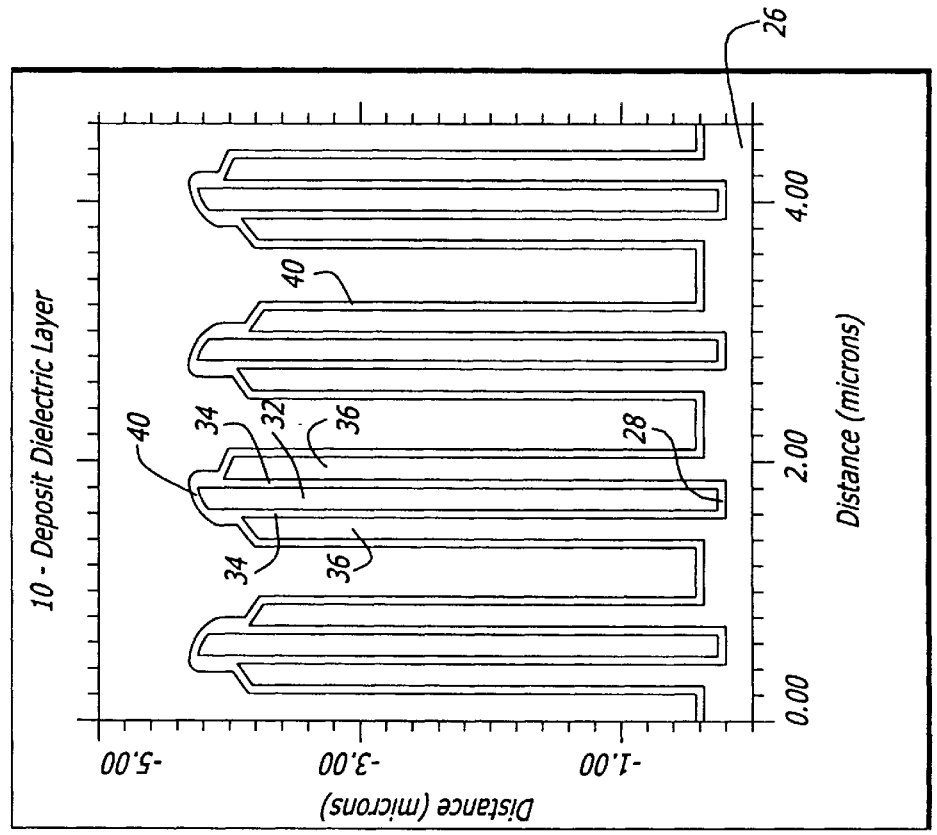

The next step, shown in FIG. 13, is the deposition of another layer of dielectric material 40. (At the present time, dielectric material depositions are targeted at 500 angstroms, though this thickness may be reduced for increased capacitance, or increased for higher voltage capabilities.) This deposition applies dielectric material between the sidewall electrodes 36 and the central electrodes 32.

The next step, shown in FIG. 14, is the deposition of another layer 42 of electrode material. A thicker layer is deposited in this example to fill the entire trenches (0.25 micron) between posts. The lateral dimensions could be changed for increased density if desired, but the dimensions set forth herein were selected as providing a more reliable structure.

Figure 15:
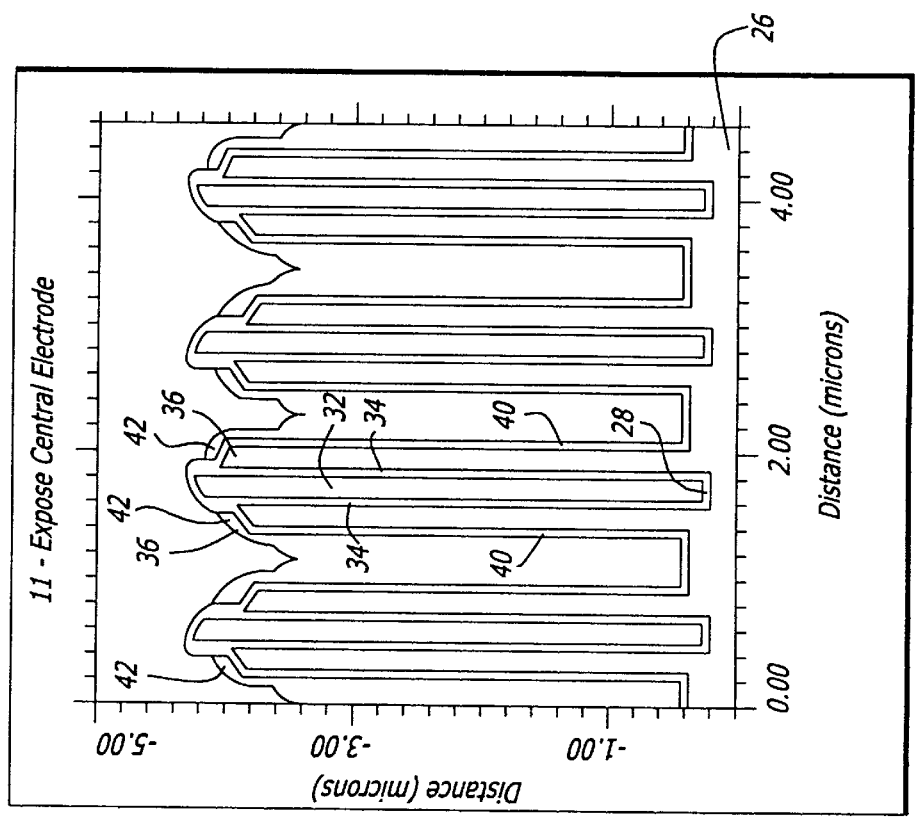

The next step, shown in FIG. 15, is to etch the electrode layer 42 using reactive ion etching (RIE) to expose the top of the post. Note that the increased thickness of the central post assures that the electrodes 36 will not be exposed at their shoulders by over etching.

Figure 17:
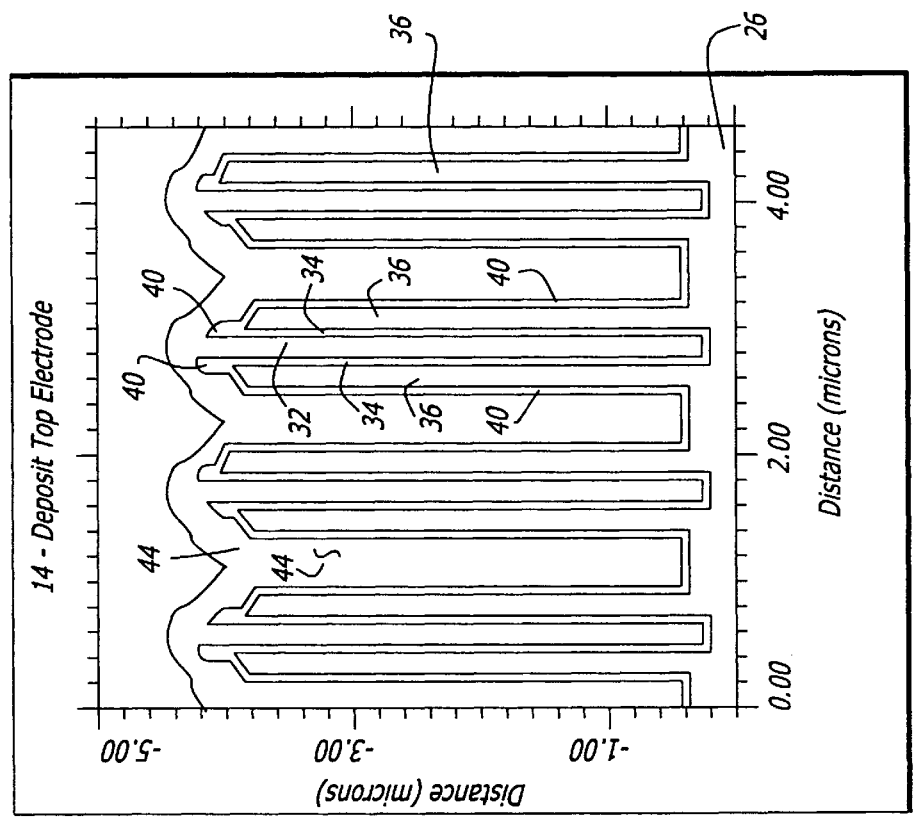
Figure 16:
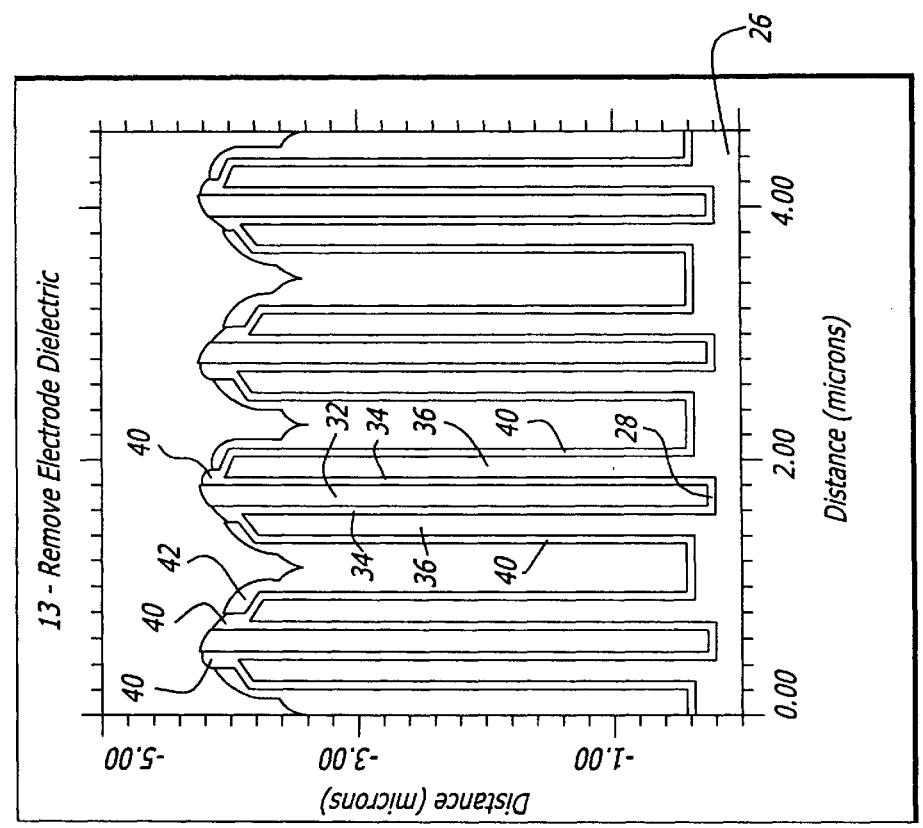

The next step, shown in FIG. 16, is the removal of the dielectric material 40 from the top of the central post by reactive ion etching, in preparation of the final electrode deposition. Then, as shown in FIG. 17, the final electrode material deposition 44, such as a TiN deposition, is made, forming the top electrode of the capacitor. This deposition electrically interconnects layers 42 and the electrode posts 32 to form one of the capacitor electrodes. The other capacitor electrode is formed by the electrical interconnection of the sidewall electrode layers 36 with the initial conductive layer 26. Note that in effect, four capacitor plate—dielectric—capacitor plate combinations have been formed about each post 32. Because of the aspect ratio of the posts, the close spacing thereof, and the thin dielectric layers the present invention has a high capacitance per unit area, even when compared to prior art attempts to achieve higher capacitances by stacking multiple capacitor plate layers (FIG. 2) on a substrate.

Figure 18:
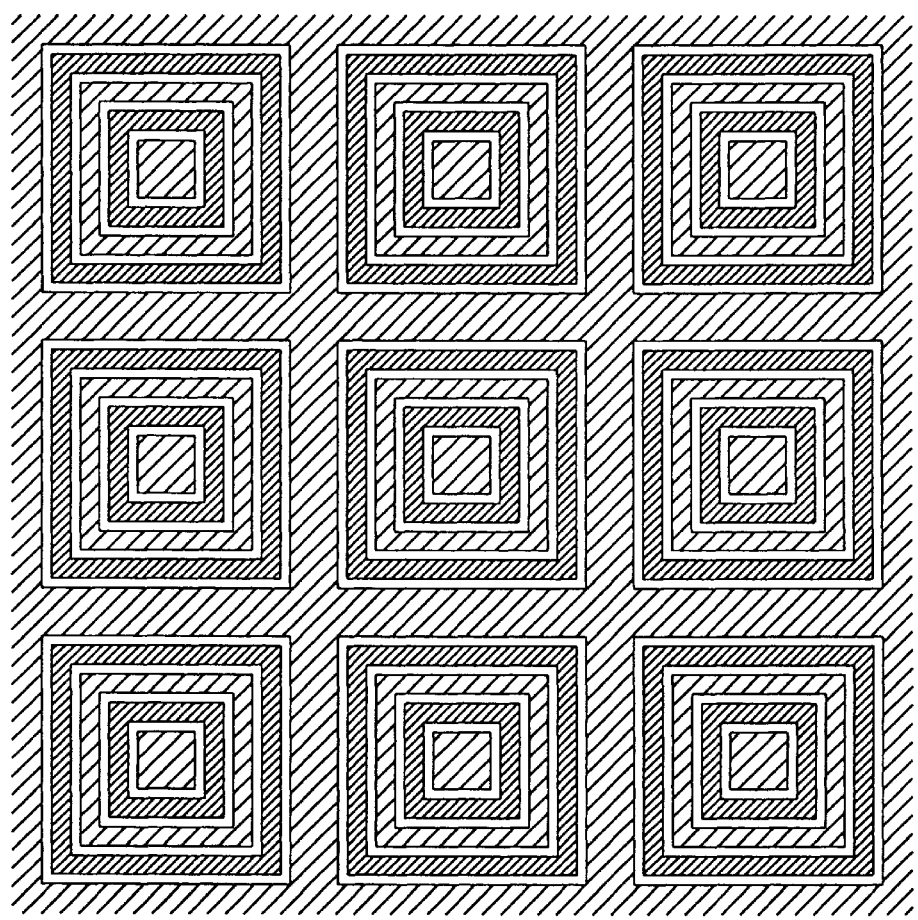
FIG. 18 illustrates a typical cross section of an exemplary capacitor of the present invention.
Figure 19:
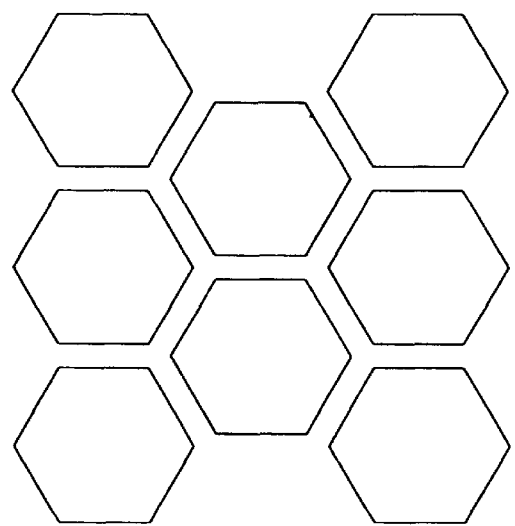
FIG. 19 illustrates the preferred capacitor layout if the initial pedestals are hexagonal in cross section.

If the initial pedestals were square pedestals, then a representative cross section taken through the resulting structure will appear as in FIG. 18. In this Figure, the conductive layers are cross-hatched, the conductive layers with the heavier cross-hatching being electrically connected to the bottom or initial conductive layers, and the conductive layers with the more open cross-hatching being electrically connected to the final deposited layer. The uncross-hatches layers are the insulative layers. If the initial pedestals were hexagonal pedestals, the cross section would show similar layers, but in a hexagonal rather than a square shape, preferably being laid out as shown in FIG. 19 to again maximize use of space.

The final structure is now ready for the application of leads, or packaging in a package in a manner similar to any semiconductor chip. If substrate materials are used in the present invention which are similar in physical characteristics (but not necessarily electrical characteristics unless semiconductor substrates are actually used) to those used in integrated circuits, and the various deposited layers are of the same materials are used in integrated circuit fabrication, semiconductor chip packaging techniques are directly applicable. Preferably, however, the substrate used during manufacture will be a temporary substrate, the capacitor being peelable and separable therefrom. Because of the thinness of the capacitive layer (3 or 4 microns), the layers should be rollable for packaging like conventional foil capacitors.

In the event still higher capacitances per unit area are desired, the aspect ratio of the posts may be increased, though at some point, perhaps for aspect ratio of over about 10, the structural integrity of the product at intermediate stages of formation will be inadequate to maintain high production yields of quality capacitors. However the structural integrity of the finished capacitor will be very good because of the substantially solid structure thereof, thereby allowing the stacking of a similar capacitor layer on top of the first capacitor. Thus the finished capacitor layers may be stacked to increase the density of the final device.

Thus, while preferred embodiments of the present invention and methods for fabrication of the same have been disclosed and described herein, it will be understood by those skilled in the art that various changes in form and detail may be made therein without departing from the spirit and scope of the invention.

What is claimed is:

1. A method of forming capacitors comprising the steps of:
   (a) providing a conductive layer;
   (b) forming an array of pedestals on the conductive layer after forming a dielectric layer on the container layer;
   (c) forming first sidewall conductors on the pedestals electrically insulated from the conductive layer of step (a);
   (d) removing the pedestals formed in step (b), leaving sidewalls at outer sides of the pedestals;
   (e) forming an insulative layer on the sidewalls of the first sidewall conductors; and,
   (f) providing a conductive layer over the device fabricated in steps (a) though (e) and in electrical contact with the first sidewall conductors.

2. The method of claim 1 wherein the pedestals are pedestals having a width, length and height, the ratio of the height to the width of the pedestals being not more than approximately 10 to 1.

3. The method of claim 1 wherein the conductive layer is a TiN layer.

4. The method of claim 1 wherein the conductive layer and the sidewall conductors are TiN.

5. The method of claim 4 wherein the insulative layer is $SiO_2$.

6. The method of claim 1 wherein the insulative layer is $SiO_2$.

7. A method of forming capacitors comprising the steps of:
   (a) providing a conductive layer;
   (b) forming an array of pedestals on the conductive layer after forming a dielectric layer on the container layer;
   (c) forming first sidewall conductors on the pedestals electrically insulated from the conductive layer of step (a);
   (d) removing the pedestals formed in step (b), leaving sidewalls at outer sides of the pedestals;
   (e) forming an insulative layer on the sidewalls of the first sidewall conductors;
   (f) forming second sidewall conductors on the sidewalls of the insulative layer formed in step (e), the second sidewall conductors being in electrical contact with the conductive layer of step (a);
   (g) forming insulative layers over the second sidewall conductors; and
   (h) providing a conductive layer over the device fabricated in steps (a) though (g) and in electrical contact with the first sidewall conductors.

8. The method of claim 7 wherein the pedestals are pedestals having a width, length and height, the ratio of the height to the width of the pedestals being not more than approximately 10 to 1.

9. The method of claim 7 wherein the conductive layer is a TIN layer.

10. The method of claim 7 wherein the conductive layer and the sidewall conductors are TIN.

11. The method of claim 10 wherein the insulative layers are $SiO_2$.

12. The method of claim 7 wherein the insulative layers are $SiO_2$.

* * * * *

UNITED STATES PATENT AND TRADEMARK OFFICE
CERTIFICATE OF CORRECTION

PATENT NO. : 5,898,982  
APPLICATION NO. : 08/866589  
DATED : May 4, 1999  
INVENTOR(S) : Metzler et al.

Page 1 of 1

It is certified that error appears in the above-identified patent and that said Letters Patent is hereby corrected as shown below:

Col. 5, Claim 1, Line 5, delete "container" and insert -- conductive --.

Col. 6, Claim 7, Line 2, delete "container" and insert -- conductive --.

Signed and Sealed this

Eleventh Day of July, 2006

JON W. DUDAS  
*Director of the United States Patent and Trademark Office*